(12) United States Patent
Tung et al.

(10) Patent No.: US 11,765,886 B2
(45) Date of Patent: Sep. 19, 2023

(54) SEMICONDUCTOR MEMORY DEVICE

(71) Applicant: Fujian Jinhua Integrated Circuit Co., Ltd., Quanzhou (CN)

(72) Inventors: Yu-Cheng Tung, Kaohsiung (TW); Huixian Lai, Quanzhou (CN); Yi-Wang Jhan, Taichung (TW)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 3 days.

(21) Appl. No.: 17/397,957

(22) Filed: Aug. 9, 2021

(65) Prior Publication Data

US 2022/0122984 A1 Apr. 21, 2022

(30) Foreign Application Priority Data

Oct. 16, 2020 (CN) .......................... 202011111626.1

(51) Int. Cl.
*H10B 12/00* (2023.01)
(52) U.S. Cl.
CPC ............. *H10B 12/34* (2023.02); *H10B 12/48* (2023.02); *H10B 12/482* (2023.02); *H10B 12/488* (2023.02); *H10B 12/50* (2023.02)
(58) Field of Classification Search
CPC ......... H01L 27/10885; H01L 27/10891; H01L 21/7685; H01L 21/76852; H01L 21/76895; H01L 21/76897; H01L 27/10897; H10B 12/482; H10B 12/488; H10B 12/50
See application file for complete search history.

(56) References Cited

U.S. PATENT DOCUMENTS

| | | | | |
|---|---|---|---|---|
| 7,755,131 B2* | 7/2010 | Kinoshita | ............... | H10B 41/41 257/317 |
| 2004/0099885 A1* | 5/2004 | Yeo | ................. | H10B 10/00 257/E27.099 |
| 2006/0077702 A1* | 4/2006 | Sugimae | ............. | H01L 27/0207 257/E27.081 |
| 2015/0303200 A1* | 10/2015 | Yuki | ................... | H01L 29/0649 257/296 |
| 2015/0371685 A1* | 12/2015 | Shin | ..................... | H10B 12/315 257/773 |
| 2018/0226408 A1* | 8/2018 | Feng | ..................... | H10B 12/50 |
| 2018/0254278 A1* | 9/2018 | Nagai | ................. | H10B 12/053 |
| 2019/0206877 A1* | 7/2019 | Kim | ......................... | G11C 8/08 |

* cited by examiner

*Primary Examiner* — Nicholas J Tobergte
*Assistant Examiner* — William Henry Anderson
(74) *Attorney, Agent, or Firm* — Winston Hsu

(57) ABSTRACT

The present invention discloses a semiconductor memory device, including a substrate, active areas, first wires and at least one first plug. The active areas extend parallel to each other along a first direction, and the first wires cross over the active areas, wherein each of the first wires has a first end and a second end opposite to each other. The first plug is disposed on the first end of the first wire and electrically connected with the first wire, wherein the first plug entirely wraps the first end of the first wire and is in direct contact with a top surface, sidewalls and an end surface of the first end. Therefore, the contact area between the plug and the first wires may be increased, the contact resistance of the plug may be reduced, and the reliability of electrical connection between the plug and the first wires may be improved.

10 Claims, 8 Drawing Sheets

SEMICONDUCTOR MEMORY DEVICE

BACKGROUND OF THE INVENTION

1. Field of the Invention

The present invention relates to a semiconductor memory device, and more particularly to a semiconductor memory device having a plug.

2. Description of the Prior Art

With the trend of miniaturization of various electronic products, the design of dynamic random access memory (DRAM) cells must also meet the requirements of high integration and high density. For a DRAM cell having a recessed gate structure, because it can obtain longer carrier channel length in the same semiconductor substrate to reduce the leakage of capacitor structure, it has gradually replaced the DRAM cell having only a planar gate structure under the current mainstream development trend.

Generally, a DRAM cell having a recessed gate structure includes a transistor device and a charge storage device to receive voltage signals from bit lines and word lines. However, there are still many drawbacks in the present DRAM cells having recessed gate structures due to the limited capability of process technology, which need to be further improved to effectively improve the performance and reliability of related memory devices.

SUMMARY OF THE INVENTION

An objective of the present invention is to provide a semiconductor memory device, in which plugs are disposed on two opposite ends of a bit line or a word line to entirely wrap the ends of the bit line or the word line. In this way, the plug can be in direct contact with the top surface, sidewall and end surface of the end, which may increase the contact area between the plug and the bit line or the word line, reduce the contact resistance of the plug, and further improve the reliability of electrical connection between the plug and the bit line or the word line.

In order to achieve the above object, one embodiment of the present invention provides a semiconductor memory device, which includes a substrate, a plurality of active areas, a plurality of first wires and at least one first plug. The active areas are parallel to each other and extend along a first direction, and the first wires cross over the active areas, wherein each of the first wires has a first end and a second end opposite to each other. The first plug is disposed on the first end of the first wire and electrically connected with the first wire, wherein an entirety of the first plug wraps the first end of the first wire and is in direct contact with a top surface, sidewalls and an end surface of the first end.

In the semiconductor memory device of the present invention, plugs are disposed at two opposite ends of a wire (bit line or word line, etc.) to entirely wrap the ends of the wire. In this way, the plug can at least directly contact a top surface, sidewalls and an end surface of the end of the wire, thereby increasing the contact area between the plug and the wire and reducing the contact resistance of the plug. Furthermore, the end of the wire may be selectively provided with a protruding portion to further increase the contact area between the plug and the wire, where the protruding portion may have various shapes (such as linear, L-shaped, arc-shaped or hook-shaped) or sizes. Therefore, the semiconductor memory device of the present invention is beneficial to improving the reliability of the electrical connection between the plug and the wire.

These and other objectives of the present invention will no doubt become obvious to those of ordinary skill in the art after reading the following detailed description of the embodiment that is illustrated in the various figures and drawings.

BRIEF DESCRIPTION OF THE DRAWINGS

FIG. 1 to FIG. 8 are schematic diagrams of a semiconductor memory device according to a first embodiment of the present invention; in which:

FIG. 1 is a schematic top view of a semiconductor memory device according to the present invention;

FIG. 2 is a schematic cross-sectional view taken along the cross line A-A' in FIG. 1;

FIG. 3 is a schematic cross-sectional view taken along the cross line B-B' in FIG. 1;

FIG. 4 is another schematic cross-sectional view taken along the cross line B-B' in FIG. 1;

FIG. 5 is a schematic cross-sectional view taken along the cross line C-C' in FIG. 1;

FIG. 6 is a schematic cross-sectional view taken along the cross line D-D' in FIG. 1;

FIG. 7 is another schematic cross-sectional view taken along the cross line D-D' in FIG. 1; and FIG. 8 is another schematic cross-sectional view taken along the cross line D-D' in FIG. 1.

DETAILED DESCRIPTION

For better understanding of the present invention, some embodiments of the present invention are listed below with the accompanying drawings, the composition and the desired effects of the present invention are described in detail for those skilled in the art.

Figure 1:
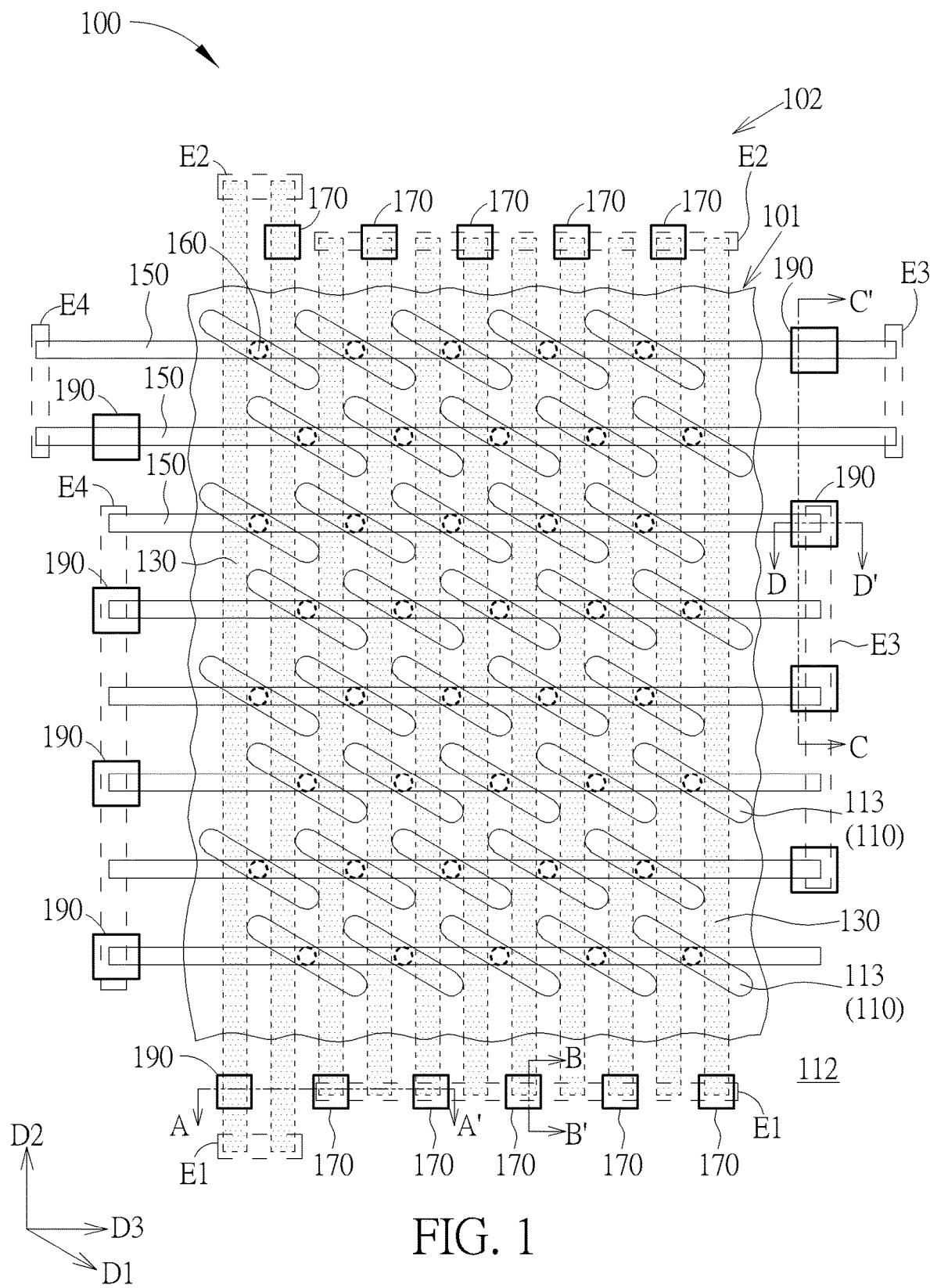

Please refer to FIG. 1 to FIG. 8, which are schematic diagrams of a semiconductor memory device 100 according to the first embodiment of the present invention, where FIG. 1 is a schematic top view of the semiconductor memory device 100, and FIGS. 2 to 8 are schematic cross-sectional views of the semiconductor memory device 100. The semiconductor memory device 100 is, for example, a dynamic random access memory (DRAM), which includes at least one transistor (not shown in the drawings) and at least one capacitor structure (not shown in the drawings) as the smallest component unit in a DRAM array which is capable of receiving voltage signals from a first wire and a second wire. The first wire is a word line (WL) 130, and the second wire is a bit line (BL) 150.

Firstly, referring to FIG. 1, the semiconductor memory device 100 includes a substrate 110, for example, a silicon substrate, a silicon-containing substrate (such as SiC, SiGe), or a silicon-on-insulator (SOI) substrate, at least one shallow trench isolation (STI) 112 is disposed in the substrate 110 to define a plurality of active areas 113 in the substrate 110. For example, the active areas 113 are parallel to and spaced apart from each other and extend along a first direction D1, and the active areas 113 are alternately disposed along the first direction D1, so that the active areas 113 may present a specific arrangement as a whole, such as an array arrangement as shown in FIG. 1, but are not limited thereto. In one embodiment, each active area 113 is formed by patterning the substrate 110. For example, the formation of each active area 113 may include forming a mask layer (not shown) on the substrate 110, where the mask layer includes a plurality of patterns (not shown in the drawings) for defining the active area 113 and exposes a portion of the substrate 110, performing an etching process with the mask layer, and forming at least one trench (not shown in the drawings) by removing the portion of the substrate 110. Then, a dielectric layer (not shown in the drawing), such as silicon oxide, silicon nitride or silicon oxynitride, is formed in the at least one trench, so as to form the shallow trench isolation 112 with top surface thereof being coplanar with the surface of the substrate 110 and to define the active areas 113. In this way, the shallow trench isolation 112 may surround the active areas 113, and the specific fabrication process for the active areas 113 is not limited to the aforementioned fabrication process. In another embodiment, the active areas may also be formed by a self-aligned double patterning (SADP) process or a self-aligned reverse patterning (SARP) process.

Figure 2:
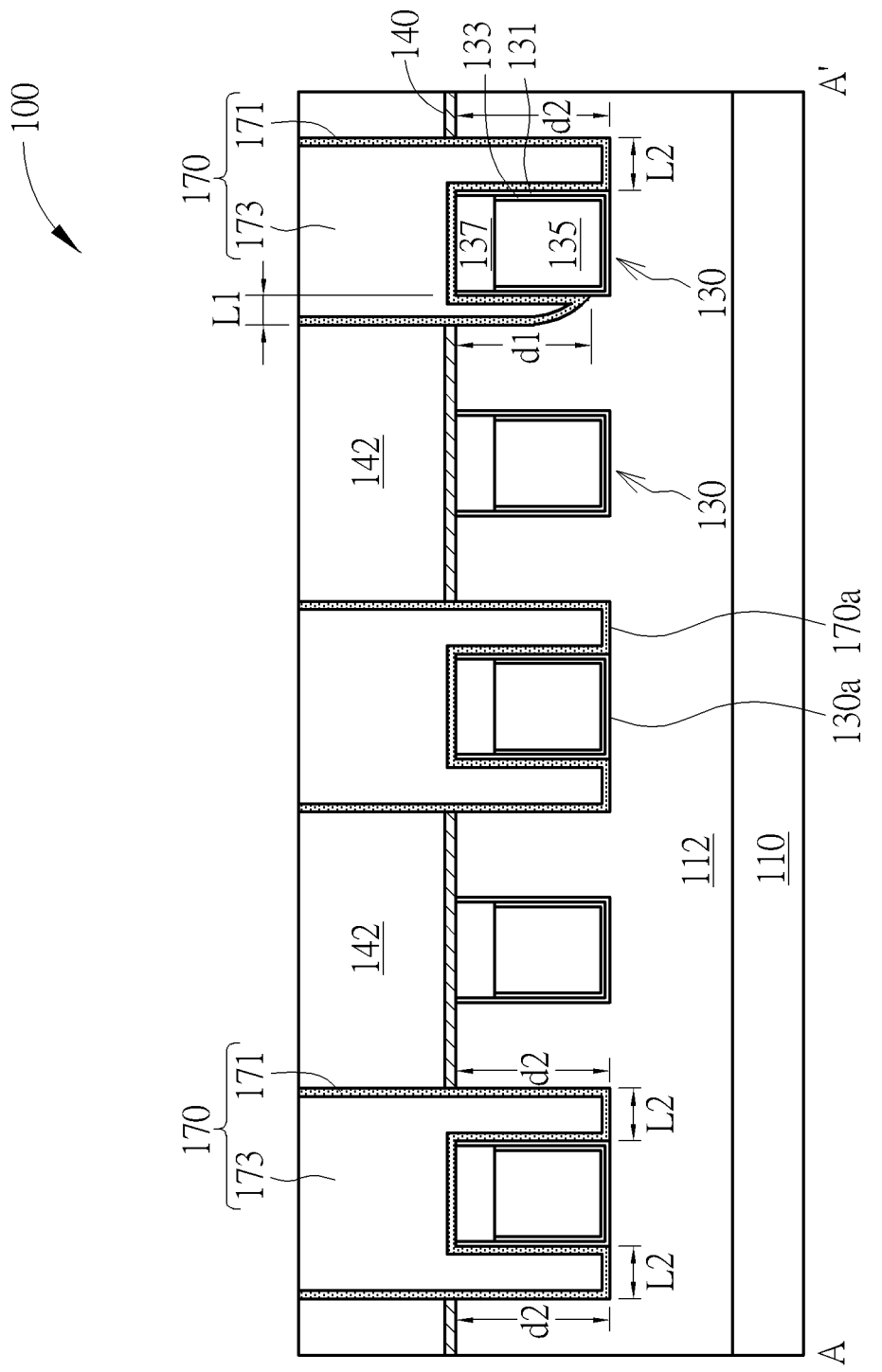

Referring to FIGS. 1 and 2, a plurality of buried gates 135 are also formed in the substrate 110, which may be used as buried word lines (BWL) 130. The word lines 130 are parallel to each other and extend along a second direction D2, across the active areas 113 (in the first direction D1), as shown in FIG. 1. In one embodiment, the word line 130 is formed by the following fabrication process, but not limited thereto. Firstly, a plurality of trenches (not shown in the drawings) are formed in the substrate 110, where the trenches are parallel to each other and extend along the second direction D2. Then, sequentially forming a dielectric layer 131 covering the whole surface of each of the trench, a gate dielectric layer 133 and a gate 135 filling the lower half portion of each of the trench, and an insulating layer 137 filling the upper half portion of each of the trench, where the top surface of the insulating layer 137 is coplanar with the surface of the substrate 110. Therefore, the gates 135 in each of the trench may be parallel to each other and extend along the second direction D2 to form the word lines 130 shown in FIG. 1.

Figure 5:
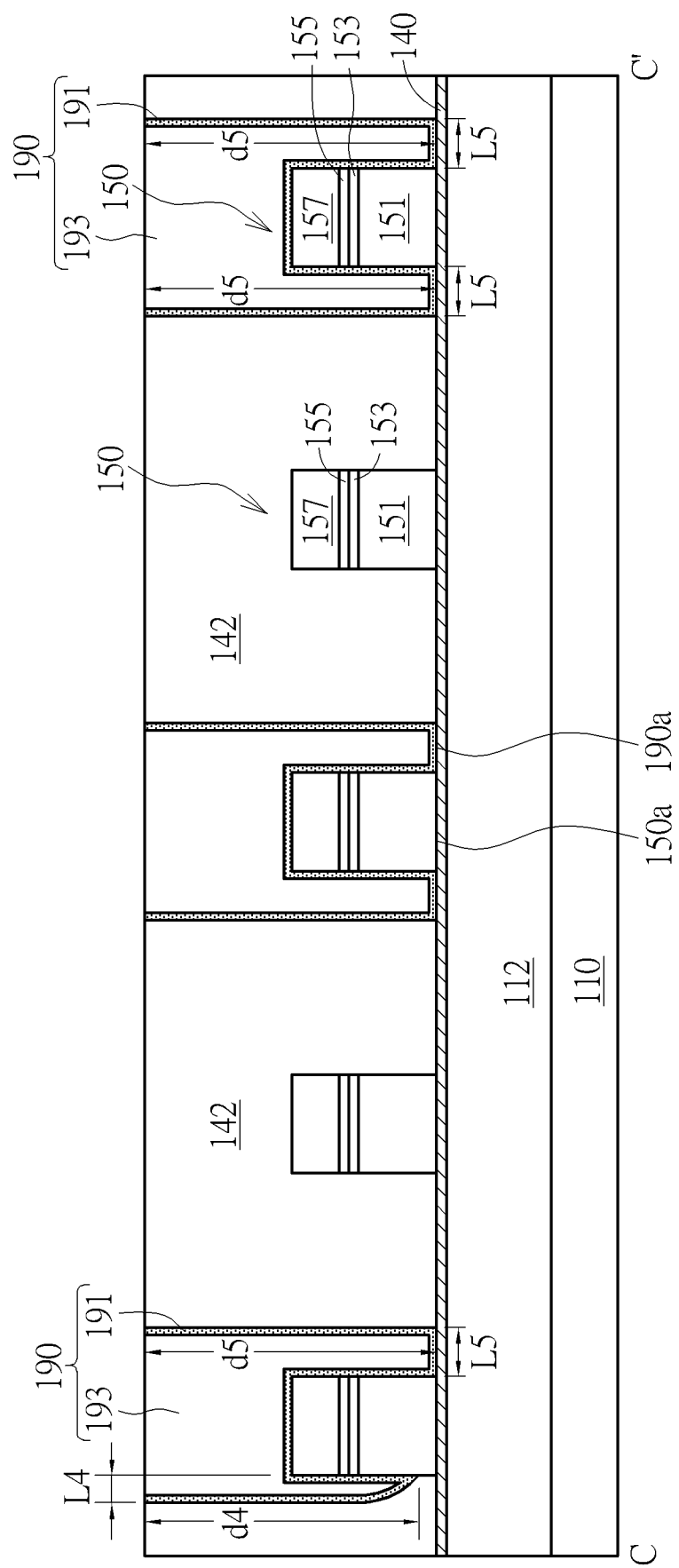

An insulating layer 140, for example, including an oxide-nitride-oxide (ONO) structure is formed on the substrate 110 to cover the surface of the substrate 110 and the word lines 130 buried in the substrate 110. Referring to FIG. 1 and FIG. 5, a plurality of bit lines 150 are also formed on the substrate 110, the bit lines 150 are parallel to each other and extend along a third direction D3, and the bit lines 150 simultaneously cross over the active areas 113 in the first direction D1 and the word lines 130 in the second direction D2. That is, the third direction D3 is different from the first direction D1 and the second direction D2, and is preferably perpendicular to the second direction D2 but not perpendicular to the first direction D1. In addition, a plurality of bit line contacts (BLC) 160 are respectively formed under a portions of the bit lines 150 that are disposed between two adjacent word lines 130. In this way, the bit lines 150 and the word lines 130 may be isolated from each other by the insulating layer 140, and each bit line 150 may be further electrically connected to a source/drain region (not shown in the drawings) of the transistor of the semiconductor memory device 100 through the bit line contacts 160.

In one embodiment, the bit lines 150 and the bit line contacts 160 are formed by the following fabrication processes, but not limited thereto. Firstly, another mask layer (not shown) is formed on the substrate 110, where the another mask layer may be used to define the position (not shown in the drawings) where the bit line contacts 160 are formed, and an etching process is performed by using the another mask layer as an etch mask to remove the insulating layer 140 at the position where the bit line contacts 160 are formed and the substrate 110 underneath, so as to form a plurality of openings (not shown in the drawings) on the surface of the substrate 110 between the adjacent word lines 130, and then the another mask layer is completely removed. When the openings are formed, an ion implantation process, such as an anti-punch-through ion implantation process, may also be performed to further form a doped region (not shown in the drawings) in the substrate 110 exposed from the openings, so as to avoid current leakage. Then, a semiconductor layer (not shown in the drawings, for example, a polysilicon layer) is formed on the substrate 110 with the semiconductor layer filling in the openings and further covering the substrate 110, and a barrier layer (not shown in the drawings, for example, a titanium layer and/or a titanium nitride layer), a metal layer (not shown in the drawings, for example, a metal with low resistivity such as tungsten, aluminum or copper) and a cover layer are sequentially formed on the semiconductor layer, but not limited thereto. Then, a patterning process is performed on the semiconductor layer, barrier layer, metal layer and cover layer stacked on one over another, so that the bit line contacts 160 may be formed by the semiconductor layer filled in the openings, and the bit lines 150 may be formed by the stacked semiconductor layer 151, barrier layer 153, metal layer 155 and cover layer 157 on the bit line contacts 160 or the substrate 110, as shown in FIG. 5. Through the aforementioned manufacturing process, the bit line contact 160 and the semiconductor layer 151 of the bit line 150 are monolithic, so that the bit line contact plug 160 and the semiconductor layer 151 of the bit line 150 may include the same material (such as polysilicon), but is not limited thereto. In another embodiment, the bit line contact plugs and the bit lines may optionally include different materials. In addition, in another embodiment, in order to simplify the manufacturing process of the semiconductor memory device 100, the word lines or the bit lines may be formed by the self-aligned double patterning process or the self-aligned reverse patterning process.

It should be noted that the semiconductor memory device 100 further includes a first region 101 and a second region 102, where the first region 101 is a region with relatively high device integration, such as a memory cell region, while the second region 102 is a region with relatively low device integration, such as a periphery region, but not limited thereto. In this embodiment, the second region 102 is disposed outside and surrounds the first region 101. The active areas 113, word lines 130 and bit lines 150 are mainly disposed in the first region 101, and the word lines 130 and bit lines 150 further extend to the second region 102 and are electrically connected to an external circuit (not shown in the drawings) through a plurality of plugs 170 and 190 disposed in the second region 102, respectively, as shown in FIG. 1. However, it should be easily understood by those skilled in the art that the relative positions of the first region and the second region are not limited to those shown in FIG. 1. Meanwhile, in order to clearly show the connection relationship between the plugs 170 and the word lines 130 or the connection relationship between the plugs 190 and the bit lines 150 in FIG. 1, only a portion of the first region 101 is drawn, so that the specific number of the active areas 113, the word lines 130 and the bit lines 150 is not limited to that shown in FIG. 1.

Specifically, the plugs 170 and 190 are preferably disposed at two opposite ends of the word lines 130 or the bit lines 150, and entirely wrap the ends. The ends of the word lines 130, for example, refer to two opposite ends of each word line 130 which occupied about 1% to 5% of the overall length of each word line 130 in the second direction D2, namely, referring to the first end of each word line 130 as shown in the dashed box E1 and the second end of each word line 130 as shown in the dashed box E2 in FIG. 1, and these first ends or these second ends are located in the shallow trench isolation 112 as shown in FIGS. 1 and 2. Referring to FIG. 1 again, the plurality of plugs 170 electrically connected the word lines 130 are alternately disposed on the first end or the second end of the word lines 130 which are adjacent with each other, that is, the plugs 170 are sequentially disposed on the first end of the first word line 130, the second end of the second word line 130, the first end of the third word line 130, and so on from the right side to left side in FIG. 1. Furthermore, the plugs 170 may be aligned with each other in a third direction D3 which is perpendicular to the second direction D2, but are not limited thereto. In this embodiment, the plugs 170 may be directly disposed on the first ends or the second ends of the word lines 130, and entirely wrap the first ends or the second ends. That is, each plug 170 may be in direct contact with at least four surfaces of the first ends or the second ends of the word lines 130, and the at least four surfaces includes a top surface of the first end or the second end, two opposite sidewall surfaces of the first end or the second end parallel to the second direction D2, and an end surface of the first end or the second end along a direction being perpendicular to the second direction D2 (i.e., the third direction D3), as shown in FIG. 1, but not limited thereto. In another embodiment, at least a portion of the plugs 170 (as shown in the left side of FIG. 1) may also be optionally disposed at positions other than the first ends or the second ends of the word lines 130, without covering the first ends or the second ends. For example, at least a portion of the word lines 130 (as shown in the left side of FIG. 1) may have a relatively long length, so that the plugs 170 disposed on the portion of the word lines 130 will not cover the two opposite ends (the first end or the second end) of the word lines 130, especially the end surfaces of the first ends or the second ends in the third direction D3. In this case, the corresponding plugs 170 may be only in direct contact with three surfaces of the word lines 130, including the top surfaces of the word lines 130 and two opposite sidewall surfaces of the word lines 130 in the second direction D2, as shown in the left side of FIG. 1. In the aforementioned embodiment, the portion of the word lines 130 (as shown in the left side of FIG. 1) are preferably disposed at the edge of the first region 101 or within the second region 102, but are not limited thereto.

Similarly, the ends of the bit lines 150 refer to, for example, the two opposite ends of each bit line 150 which occupied about 1% to 5% of the overall length of each bit lines 150 in the third direction D3, namely, referring to the first end of each bit line 150 as shown in the dashed box E3 and the second end of each bit line 150 as shown in the dashed box E4 in FIG. 1, and these first ends or these second ends are located on the shallow trench isolation 112 as shown in FIGS. 1 and 5. Referring to FIG. 1 again, the plurality of plugs 190 electrically connected bit lines 150 are alternately disposed on the first ends or the second ends of the bit lines 150 which are adjacent with each other, that is, the plugs 190 are sequentially disposed on the second ends of the first bit lines 150, the first ends of the second bit lines 150, the second ends of the third bit lines 150, and so on from the bottom side to the top side in FIG. 1. Furthermore, the plugs 190 are aligned with each other in the second direction D2 which is perpendicular to the third direction D3. In this embodiment, the plugs 190 may be directly disposed on the first ends or the second ends of the bit lines 150, and entirely wrap the first ends or the second ends. That is, each plug 190 may be in direct contact with at least four surfaces of the first end or the second end, the at least four surfaces include a top surface of the first end or the second end, two opposite sidewall surfaces of the first end or the second end in the third direction D3, and an end surface of the first end or the second end along a direction being perpendicular to the third direction D3 (i.e., the second direction D2), as shown in FIG. 1, but not limited thereto. In another embodiment, at least a portion of the plugs 190 (as shown in the top side of FIG. 1) may also be optionally disposed at positions other than the first ends or the second ends of the bit lines 150 without covering the first ends or the second ends. For example, the portion of the bit lines 150 (as shown in the top side of FIG. 1) may each have a relatively long length, so that the plugs 190 disposed on the portion of the bit lines 150 will not cover the two opposite ends (the first ends or the second ends) of the bit lines 150, especially the first ends or the second ends in the second direction D2. In this case, the portion of the plugs 190 may each be only in direct contact with three surfaces of each bit line 150, including the top surface of the bit line 150 and two opposite sidewall surfaces of the bit line 150 in the third direction D3, as shown in the top side of FIG. 1. In the aforementioned embodiment, the portion of the bit lines 150 (as shown in the upper part of FIG. 1) are preferably disposed at the edge of the first region 101 or within the second region 102, but not limited thereto.

Figure 3:
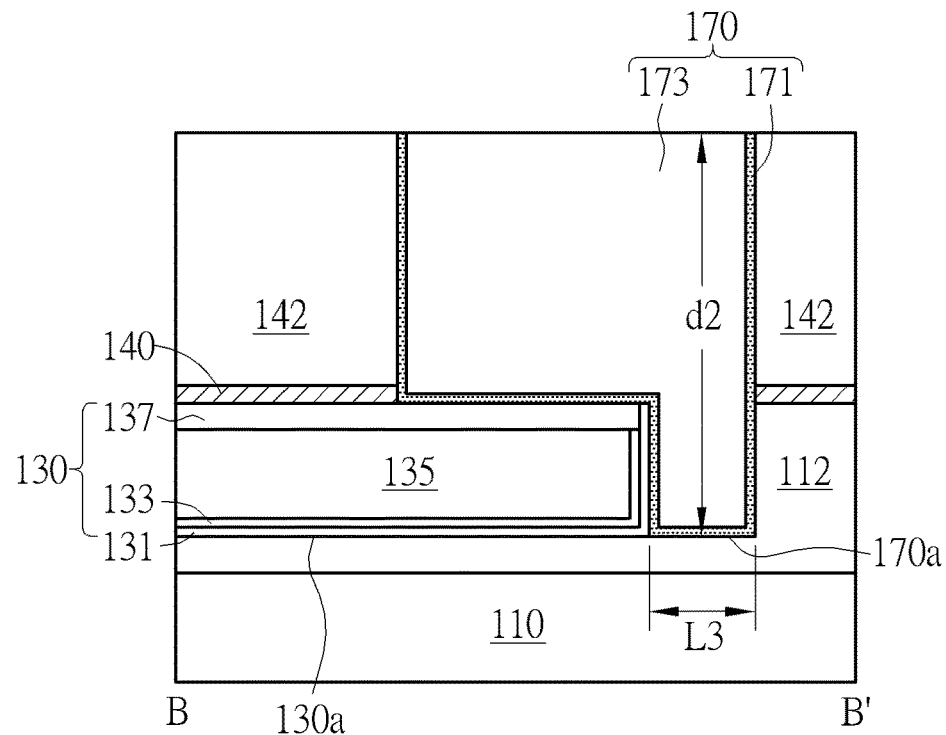
Figure 6:
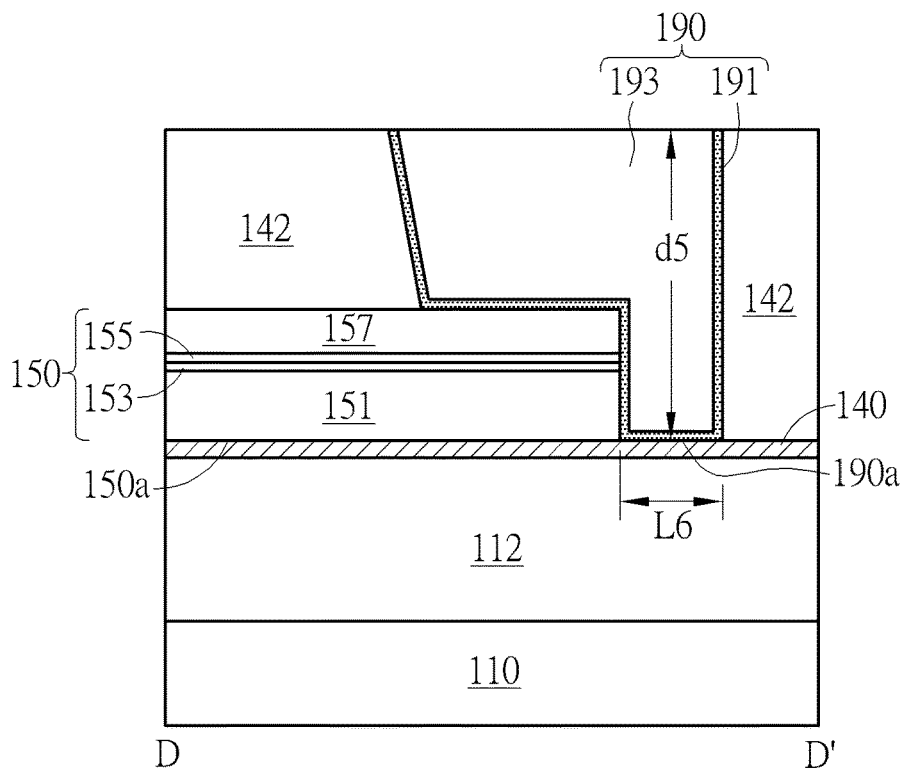

On the other hand, portions of each plug 170 and each plug 190 that respectively cover the surfaces (including the top surfaces, sidewall surfaces and/or end surfaces) of the word line 130 (the first end or the second end) or the bit line 150 (the first end or the second end) may have the same or different thicknesses, and accordingly, these portions of each plug 170 or each plug 190 may have the same or different depths in the direction perpendicular to the substrate 110. In an embodiment, the plug 170 or the plug 190 is formed by the following manufacturing processes, but not limited thereto; in addition, the manufacturing processes of the plugs 170 may be performed simultaneously with or separately from the manufacturing processes of the plugs 190. Firstly, an insulating layer 142 is formed, which is made of silicon oxide, silicon oxynitride or silicon nitride, and entirely covers the substrate 110 as an interlayer dielectric (ILD) layer. Then, a further mask layer (not shown in the drawings) is formed on the insulating layer 142, the further mask layer may be used to define the forming position (not shown in the drawings) of the plugs 170 or the plugs 190, and an etching process is performed by using the further mask layer as an etch mask to remove the insulating layer 142 at the forming position of the plugs 170 or the plugs 190, as well as the insulating layer 140 underneath, or only remove the insulating layer 142 at the forming position of the plugs 170 or the plugs 190. Afterwards, a plurality of plug holes (not shown in the drawings) are formed to expose the first end or the second end of the word lines 130 or the bit lines 150, respectively, and the further mask layer is completely removed. Then, a barrier layer (not shown in the drawings, for example, containing titanium, titanium nitride, tantalum or tantalum oxide) and a metal layer (not shown in the drawings, for example, containing aluminum, tungsten, copper or other low-resistance metal materials) are deposited sequentially to fill up each of the plug holes, and then the plugs 170 or plugs 190 are formed after performing an etch-back process. In this way, the top surface of the plug 170 or the plug 190 may be coplanar with the top surface of the insulating layer 142. Each plug 170 may include a barrier layer 171 covering the surface of each plug hole and a metal layer 173 filling in each plug hole, as shown in FIGS. 2 and 3. Each plug 190 may include a barrier layer 191 covering the surface of each plug hole and a metal layer 193 filling in each plug hole, as shown in FIGS. 5 and 6.

Figure 4:
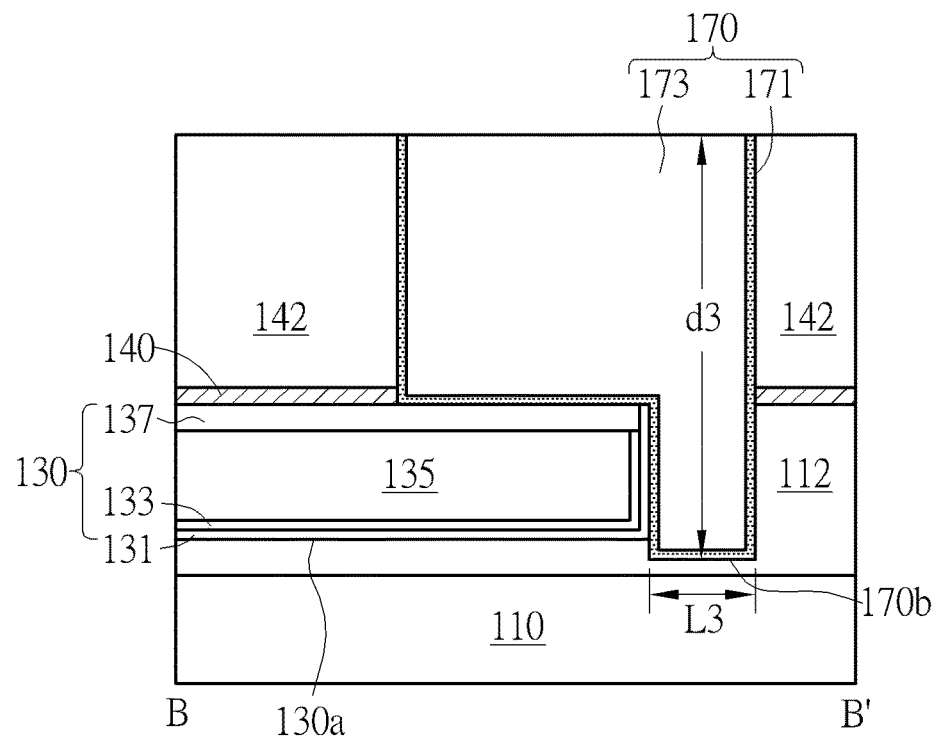

It should be noted that during the etching process for forming the plug holes, the etchant or etching gas may be blocked by the word lines 130 (the first ends or the second ends) or bit lines 150 (the first ends or the second ends) underneath. Therefore, when the sidewalls of the plug holes are too close to the word lines 130 (the first ends or the second ends) or bit lines 150 (the first ends or the second ends), the etchant or the etching gas may not flow through the gap successfully, which may influence the etching rate of the etching process. Therefore, the sidewall of the plug 170 (as shown in the right side of FIG. 2) may gradually incline toward the word line 130 (the first end or the second end) until being in direct contact with the sidewall surface of the word line 130, so that the portions of the plug 170 (shown in the right side of FIG. 2) that cover the two opposite sidewalls of the word line 130 (the first end or the second end) respectively may have different depths d1 and d2 in the substrate 110 (namely within STI 112), respectively, as shown in FIG. 2. Furthermore, the maximum distance L1 between the sidewall of the plug 170 with smaller depth d1 (as shown in the right side of FIG. 2) and the sidewall surface of word line 130 (as shown in the right side of FIG. 2) is less than the maximum distance L2 between the sidewall of the plug 170 with larger depth d2 (as shown in the right side of FIG. 2), namely, the portions of the plug 170 (as shown in the right side of FIG. 2) that respectively cover two opposite sidewall surfaces of the word line 130 (the first end or the second end) may have different thicknesses L1 and L2, as shown in the right side of FIG. 2. In another embodiment, the portions of the plug 170 (as shown in the left side of FIG. 2) that respectively cover the two opposite sidewalls of the word line 130 (the first end or the second end) may also have the same depth d2 in the substrate 110 (namely within STI 112), and also have the same thickness L2 as shown in the left side of FIG. 2. Preferably, the portion of the plug 170 that covers the end surface of the word line 130 (the first end or the second end) may have a relatively maximum thickness L3 (thickness L3>thickness L1 or thickness L2) to ensure that the plug 170 may entirely wrap the end surface of the first end or the second end, as shown in FIG. 3. In addition, in the aforementioned embodiments, the maximum depth d2 of portions of each plug 170 that respectively cover surfaces of each word line 130 (the first ends or the second ends) in the STI 112 is illustrated as an aspect not exceeding the depths of the word lines 130 (the first ends or the second ends) in the STI 112, so that bottom surfaces 170a of the plugs 170 covering each portion of the surfaces of the word lines 130 (the first ends or the second ends) may be coplanar with bottom surfaces 130a of the word lines 130 (the first ends or the second ends), as shown in FIGS. 2 and 3, but not limited thereto. It can be easily understood by those skilled in the art that, in other embodiments, the depths of the plugs 170 formed in the substrate 110 may also be adjusted according to actual process requirements, so that at least one bottom surface of each portion of the surfaces of the word lines 130 (the first ends or the second ends) covered by the plugs 170 is lower than the bottom surfaces 130a of the word lines 130, for example, FIG. 4 illustrates an aspect that the portion of the plug 170 that covers the end surface of the word line 130 (the first end or the second end) has a bottom surface 170b lower than the bottom surface 130a of the word line 130, so that the portion may have a relatively large depth d3 in the substrate 110. In other words, the distances between the sidewalls of the plugs 170 and the surfaces of the word lines 130 may be the same or different, so that the thicknesses of the portions of the plugs 170 that respectively cover the surfaces of the word lines 130 may be correspondingly the same or different. In one embodiment, the greater the distances between the sidewalls of the portions of the plugs 170 and the surfaces of the word lines 130, the deeper the depths of the portions of the plugs 170 in the direction perpendicular to the substrate 110, such as the portion of the plug 170 that covers the end surface of the word line 130, but not limited thereto.

Figure 7:
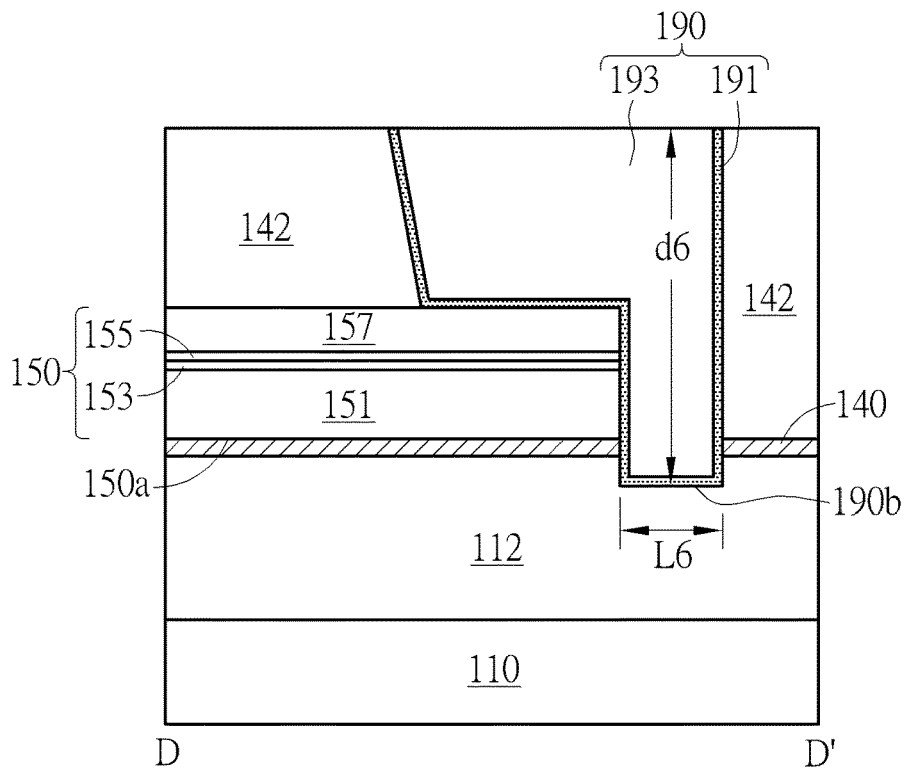

Similarly, the sidewall of the plug 190 (as shown in the left side of FIG. 5) may gradually incline toward the bit line 150 (the first end or the second end) until being in direct contact with the sidewall surface of the bit line 150 (the first end or the second end), so that the portions of the plug 190 (as shown in the left side of FIG. 5) that cover the two opposite sidewall surfaces of the bit line 150 (the first end or the second end) may have different depths d4 and d5 in the insulating layer 142, respectively, as shown in FIG. 5. Furthermore, the maximum distance L4 between the sidewall of the plug 190 with smaller depth d4 (as shown in the left side of FIG. 5) and the sidewall surface of bit line 150 (the first end or the second end) is less than the maximum distance L5 between the sidewall of the plug 190 with larger depth d5 (as shown in the left side of FIG. 5) and the sidewall surface of bit line 150 (the first end or the second end), namely, the portions of the plug 190 (as shown in the right side of FIG. 5) that respectively cover two opposite sidewall surfaces of the bit line 150 (the first end or the second end) may have different thicknesses L4 and L5, as shown in the right side of FIG. 5. In another embodiment, the portions of the plug 190 (as shown in the right side of FIG. 5) that respectively cover the two opposite sidewall surfaces of the bit line 150 (the first end or the second end) may also have the same depth d5 in the insulating layer 142, and also have the same thickness L5 as shown in the right side of FIG. 5. Preferably, the portion of the plug 190 that covers the end surface of the bit line 150 (the first end or the second end) may have a relatively maximum thickness L6 (thickness L6>thickness L4 or thickness L5) to ensure that the plug 190 may entirely wrap the end surface of the first end or the second end, as shown in FIG. 6. In addition, in the aforementioned embodiments, the maximum depth d5 of each portion of the plugs 190 covering the surfaces of the bit lines 150 (the first ends or the second ends) in the insulating layer 142 is illustrated as an aspect not exceeding the depths of the bit lines 150 (the first ends or the second ends) in the insulating layer 142, so that bottom surfaces 190a of the plugs 190 covering the surfaces of the bit lines 150 (the first ends or the second ends) may be coplanar with the bottom surfaces 150a of the bit lines 150 (the first ends or the second ends), that is, on the insulating layer 140, as shown in FIGS. 5 and 6, but not limited thereto. It can be easily understood by those skilled in the art that in other embodiments, the depths of the plugs 190 formed in the insulating layer 142 may be further adjusted according to actual process requirements, so that at least one of the bottom surfaces of the portions of each plug 190 that cover the surfaces of the bit lines 150 (the first ends or the second ends) may also be lower than the bottom surfaces 150a of the bit lines 150. For example, FIG. 7 illustrates an aspect that the bottom surface 190b of the portion of the plug 190 that cover the end surface of the bit line 150 (the first end or the second end) is lower than the bottom surface 150a of the bit line 150, so that the portion of the plug 190 may further penetrate through the insulating layer 140 to have a relatively large depth d6. In other words, the distances between the sidewalls of each plug 190 and the sidewall surfaces of each bit line 150 (the first ends or the second ends) may be the same or different, so that the thicknesses of portions of the plug 190 that cover different sidewall surfaces of the bit lines 150 may be correspondingly the same or different. In one embodiment, the greater the distances between the sidewalls of the portions of the plugs 190 and the surfaces of the bit lines 150, the deeper the depth of the portions of the plugs 190 in the direction perpendicular to the substrate 110, such as the portions of the plugs 190 that cover the end surfaces of the word lines 150, but not limited thereto.

Figure 8:
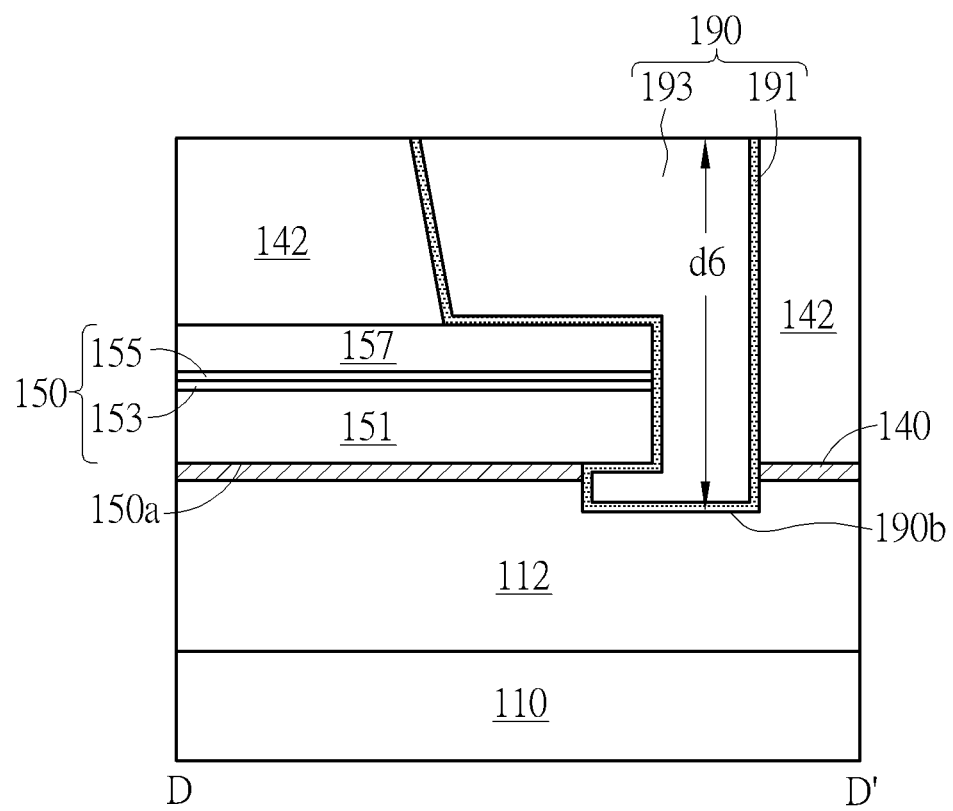

In addition, in the aspect that the plug 190 may further penetrate through the insulating layer 140, after the plug hole is etched downwardly to remove the insulating layer 140, and a lateral etching process may also be optionally performed then to partially remove the shallow trench isolation 112 under the bit line 150 (the first end or the second end). Accordingly, the formed plug 190 may further cover the bottom 150a of a portion of the bit line 150, as shown in FIG. 8, whereby, the plug 190 may be in direct contact with five surfaces of the bit line 150 (the first end or the second end), and the five surfaces include the top and the bottom surfaces of the first end or the second end, two opposite sidewall surfaces, and the end surfaces, thereby increasing the contact area between the plug 190 and the bit line 150.

Therefore, in the semiconductor memory device 100 according to the first embodiment of the present invention, the plugs 170 electrically connected to the word lines 130 and/or the plugs 190 electrically connected to the bit lines 150 are disposed at two opposite ends of the word lines 130 or the bit lines 150, entirely wrapping the ends. Therefore, the plugs 170 and/or the plugs 190 may be in direct contact with at least four surfaces of the word lines 130 (the first ends or the second ends) or the bit lines 150 (the first ends or the second ends), including the top surface, two opposite sidewall surfaces and end surfaces of the first ends or the second ends, in order to increase the contact areas between the plugs 170 and the word lines 130 and/or the plugs 190 and the bit lines 150, so that the plugs 170 electrically connected to the word lines 130 and/or the plugs 190 electrically connected to the bit lines 150 may have relatively low contact resistances (Rc). In addition, the portions of the plugs 170 that cover the surfaces of the word lines 130 and/or the portions of the plugs 190 that cover the surfaces of the bit lines 150 (the surfaces includes the top surface, sidewall surface and/or end surface, even the bottom surface) may have the same or different thicknesses respectively. Accordingly, the portions of the plugs 170 and/or 190 may also have the same or different depths in the direction perpendicular to the substrate 110, moreover, the depth of the portion with relatively thick thickness is relatively deeper. Preferably, the portions of the plugs 170 covering the end surfaces of the word lines 130 and/or the portions of the plugs 190 covering the end surfaces of the bit lines 150 may have a relatively maximum thickness L3/L6 and a depth d2/d5 (or a depth d3/d6) compared with the portions of the plugs 170 and/or the plugs 190 covering other surfaces of the word lines 130 and the bit lines 150, so as to ensure that the plugs 170 and/or 190 may entirely wrap the end surfaces of the ends (the first ends or the second ends) of the word lines 130 and/or bit lines 150.

It would be easily understood by those skilled in the art that, depending on the actual product requirements, the semiconductor memory device of the present invention may have other aspects or be formed by other manufacturing processes, but is not limited to the foregoing. For example, although the aforementioned embodiment is exemplified by arranging the plugs 170 electrically connected to word lines 130 and/or plugs 190 electrically connected to bit lines 150, but the present disclosure is not limited thereto. In another embodiment, the aforementioned arrangements of plugs 170 and/or plugs 190 may also be applied on other wires which are electrically connected to the semiconductor memory device, or the plugs 170 and/or the plugs 190 may also have various arrangements. Therefore, other embodiments or variations of the semiconductor memory device and the forming method thereof will be further explained below. In order to simplify the explanation, the following description mainly focuses on the differences between embodiments, and will not repeat the similarities. In addition, the same components in each embodiment of the present invention are labeled with the same reference numerals, which is convenient for comparison among the embodiments.

Figure 9:
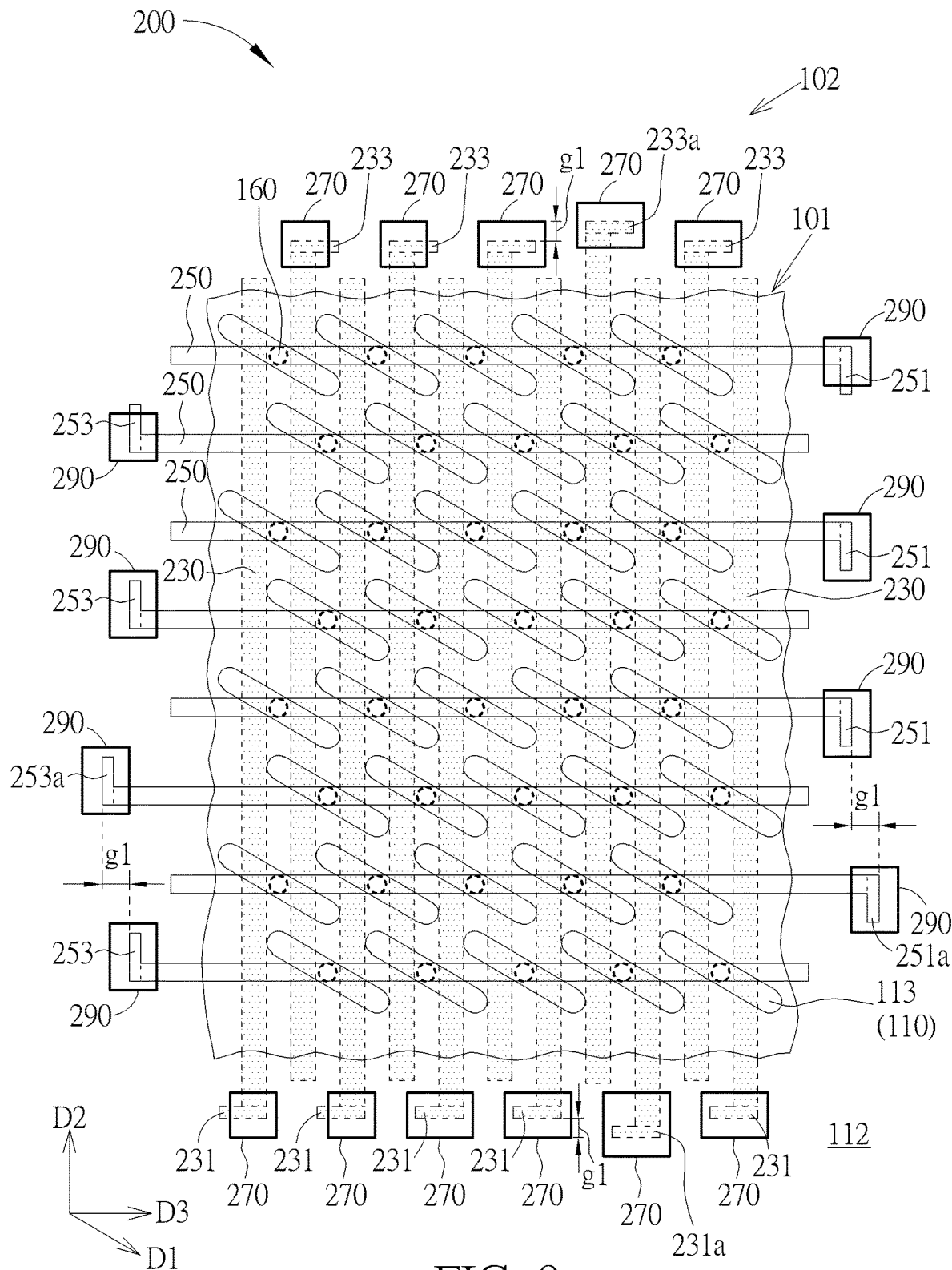
FIG. 9 is a schematic top view of a semiconductor memory device according to a second embodiment of the present invention.

Please refer to FIG. 9, which is a schematic diagram of a semiconductor memory device 200 in the second embodiment of the present invention. The semiconductor memory device 200 of this embodiment is substantially the same as the semiconductor memory device 100 in the first embodiment, including the substrate 110, the shallow trench isolation 112, the active region 113, etc., and the similarities will not be repeated. The main difference between this embodiment and the previous embodiment is in that protruding portions are additionally disposed at the two opposite ends of the word lines 230 or bit lines 250 with the protruding portions extending in a direction perpendicular to the word lines 230 or bit lines 250, and the plugs 270 and/or plugs 290 electrically connected to the word lines 230 and/or bit lines 250 are still disposed at the two opposite ends of the word lines 230 or bit lines 250 to entirely wrap the ends and the protruding portions, or partially cover the ends and the protruding portions selectively.

In detail, a protruding portions 231 and a protruding portions 233 are respectively disposed on the first ends and the second ends of the word lines 230, extending in a direction perpendicular to the word lines 230 (i.e., perpendicular to the second direction D2), so that each word line 230 may be L-shaped or inverted L-shaped as a whole in the second direction D2, but not limited thereto. The protruding portions 233 disposed at the second end of the word line 230 extends in the third direction D3, while the protruding portions 231 disposed at the first end of the word line 230 extends in the opposite direction to the third direction D3, as shown in FIG. 9. In one embodiment, the protruding portions 231 and the protruding portions 233 may have the same length, and thereby the two adjacent word lines 230 may be rotational symmetry with respect to a geometric axis (not shown), but not limited thereto. In another embodiment, the protruding portions disposed at the first end or the second end may have different lengths selectively. Therefore, the plugs 270 disposed on the two opposite ends of the word lines 230 for electrically connecting the word lines 230 may be in direct contact with more surfaces of the first ends or the second ends on the prerequisite for entirely wrapping the first ends or the second ends and the protruding portions 231 or 233 disposed at the first ends or the second ends, thereby further increasing the contact areas between the plugs 270 and the word lines 230 and effectively reducing the resistance value of the plugs 270. The distance between each sidewall of plugs 270 and each surface of protruding portions 231 or 233 may be the same or different, so that the thicknesses of the portions of the plugs 270 respectively covering the surfaces of the protruding portions 231 or 233 may be the same or different correspondingly. In one embodiment, the greater the distances between the sidewalls of the portions of the plugs 270 and the surfaces of protruding portions 231 or 233, the deeper the depths of the portions of the sidewalls of plugs 270 in the direction perpendicular to the substrate 110, and preferably, the portions of the plugs 270 refer to the portions covering the end surfaces of the protruding portions 231 or the protruding portions 233 in the second direction D2, but not limited thereto.

Similarly, protruding portions 251 and protruding portions 253 are respectively disposed on the first ends and the second ends of the two adjacent bit lines 250, extending along a direction perpendicular to the bit lines 250 (i.e., perpendicular to the third direction D3), so that each bit line 250 may be L-shaped or inverted L-shaped as a whole in the third direction D3, but not limited thereto. The protruding portions 253 disposed on the second ends of the bit lines 250 extend in the second direction D2, while the protruding portions 251 disposed on the first ends of the bit lines 250 extends in the opposite direction of the second direction D2, as shown in FIG. 9. In one embodiment, the protruding portions 251 and the protruding portions 253 may have the same length, and thereby the two adjacent bit lines 250 may form a shape having rotational symmetry with respect to a geometric axis (not shown), but not limited thereto. In another embodiment, the protruding portions disposed on the first ends or the second ends may have different lengths selectively. Therefore, the plugs 290 disposed on two opposite ends of the bit lines 250 for electrically connected to the bit lines 250 may be in direct contact with more surfaces of the first ends or the second ends on the prerequisite for entirely wrapping the first ends or the second ends and the protruding portions 251 or 253 disposed on the first ends or the second ends, thereby further increasing the contact areas between the plugs 290 and the bit lines 250, and effectively reducing the resistance of the plugs 290. The distance between each sidewall of plugs 290 and each surface of protruding portions 251 or 253 may be the same or different, so that the thicknesses of the portions of the plugs 290 respectively covering the surfaces of the protruding portions 251 or 253 may be the same or different correspondingly. In one embodiment, the greater the distances between the sidewalls of the portions of the plugs 290 and the surfaces of protruding portions 251 or 253, the deeper the depths of the portions of the sidewalls of plugs 290 in the direction perpendicular to the substrate 110, and preferably, the portions of the plugs 270 are the portions covering the end surfaces of the protruding portions 251 or the protruding portions 253 in the third direction D3, but not limited thereto.

On the other hand, in one embodiment, the two adjacent word lines 230 may be optionally aligned with each other in the third direction D3 (as shown in the left side of FIG. 9), or may be arranged in a staggered manner (as shown in the right side of FIG. 9). That is to say, the first ends or the second ends of the two adjacent word lines 230 may be staggered by a distance g1 in the second direction D2, so that the protruding portions 231 and protruding portions 231a disposed on the first ends or the protruding portions 233 and the protruding portions 233a disposed on the second ends may also be staggered by the distance g1, as shown on the right side of FIG. 9. Alternatively, the two adjacent bit lines 250 may be optionally aligned with each other in the second direction D2 (as shown in the upper part of FIG. 9), or may be arranged in a staggered manner (as shown in the lower part of FIG. 9). That is to say, the first ends or the second ends of the two adjacent bit lines 250 may be staggered by the distance g1 in the third direction D3, so that the protruding portions 251 and protruding portions 251a disposed on the first ends or the protruding portions 253 and the protruding portions 253a disposed on the second ends may also be staggered by the distance g1 correspondingly, as shown in the lower part of FIG. 9. In this way, when the plugs 270 electrically connected to the word lines 230 or the plugs 290 electrically connected to the bit lines 250 are provided, the adjacent plugs 270 or the adjacent plugs 290 may have a relatively large manufacturing space to avoid short circuit. In addition, in another embodiment, the plugs 270 electrically connected to the word lines 230 or the plugs 290 electrically connected to the bit lines 250 may also entirely wrap the first ends or the second ends selectively, however, the plugs 270, 290 only partially cover the protruding portions 231/251 or protruding portions 233/253 disposed on the first ends or the second ends, such that at least one surface of the protruding portions 231/251 or the protruding portions 233/253 (such as the end surfaces of the protruding portions 231/251 or the protruding portions 233/253) is not covered by the plugs 270/plugs 290, so that there may be a relatively larger space between adjacent plugs 270 (as shown in the left side of FIG. 9) or adjacent plugs 290 (as shown in the upper side of FIG. 9).

Therefore, in the semiconductor memory device 200 according to the second embodiment of the present invention, the contact areas of the plugs 270 electrically connected to the word lines 230 and/or the plugs 290 electrically connected to the bit lines 250 are further increased and the resistance of the plugs 270 and/or the plugs 290 may be more effectively reduced through the protruding portions disposed on the opposite ends of the word lines 230 and/or the bit lines 250. It would be easily understood by those skilled in the art that although the shapes of the protruding portions in the aforementioned embodiments are described as straight lines, the shapes are not limited thereto. On the prerequisite for increasing the contact areas between the plugs and the wires, the protruding portion may have more variations or aspects of arrangements based on actual assembly requirements. For example, in other embodiments, the protruding portions may have other shapes, such as L-shape, or different sizes or lengths.

Figure 10:
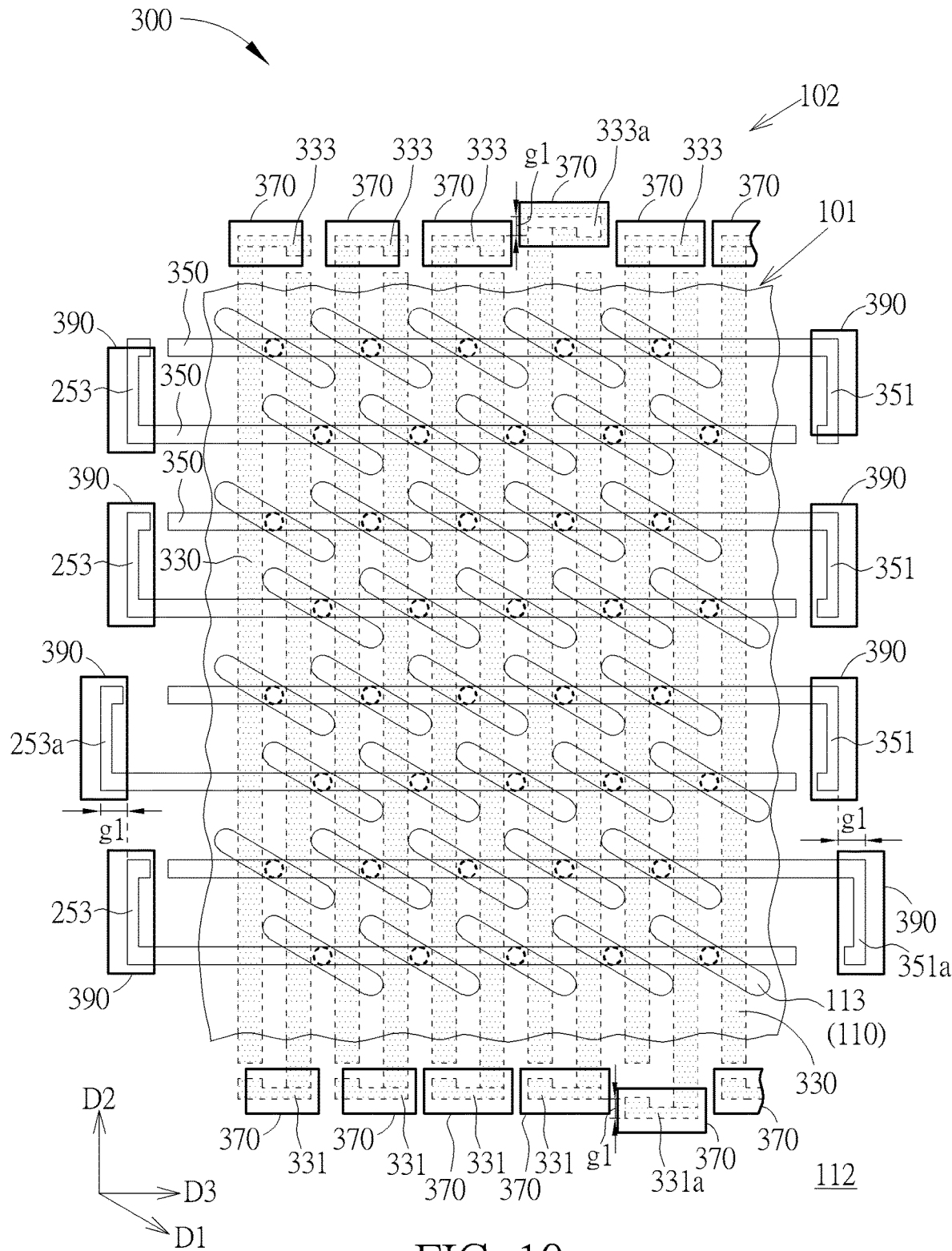
FIG. 10 is a schematic top view of a semiconductor memory device according to a third embodiment of the present invention.

Please refer to FIG. 10, which is a schematic diagram of a semiconductor memory device 300 in the third embodiment of the present invention. The semiconductor memory device 300 of this embodiment is substantially the same as the semiconductor memory device 200 in the aforementioned second embodiment, and the similarities will not be repeated. However, the main difference between this embodiment and the previous embodiment is the shapes of the protruding portions. The plugs 370 electrically connected to the word lines 330 and/or the plugs 390 electrically connected to the bit lines 350 are still disposed at two opposite ends of the word lines 330 or the bit lines 350, and may selectively wrap the ends and the protruding portions entirely or partially.

In detail, the protruding portions 331 and 333 disposed on the first ends or the second ends of the word lines 330 are, for example, L-shaped or inverted L-shaped. Preferably, each protruding portion 333 disposed on the first ends and each protruding portions 331 disposed on the second ends may have the same size and shape. In this way, the two adjacent word lines 330 may be rotationally symmetric with respect to a geometric axis (not shown), but are not limited thereto. However, in another embodiment, the protruding portions disposed on the first ends or the second ends of the word lines 330 may have different sizes or shapes selectively. Therefore, the plugs 370 disposed on the two opposite ends of the word lines 330 for electrically connecting the word lines 330 may be in direct contact with more surfaces of the first ends or the second ends on the prerequisite for entirely wrapping the first ends or the second ends and the protruding portions 331 or 333 disposed on the first ends or the second ends, thereby further increasing the contact areas between the plugs 370 and the word lines 330, and further effectively reducing the resistance value of the plugs 370. Similarly, the protruding portions 351 and 353 disposed on the first ends or the second ends of the bit lines 350 may also be L-shaped or inverted L-shaped, and each protruding portion 353 disposed on the first end and each protruding portion 351 disposed on the second end preferably have the same size and shape. In this way, the two adjacent bit lines 350 can be rotationally symmetric with respect to a geometric axis (not shown), but are not limited thereto. However, in another embodiment, the protruding portions disposed on the first ends or the second ends of the bit lines 350 may have different sizes or shapes selectively. Therefore, the plugs 390 disposed on the two opposite ends of the bit lines 350 for electrically connecting the bit lines 350 may be in direct contact with more surfaces of the first ends or the second ends on the prerequisite for entirely wrapping the first ends or the second ends and the protruding portions 351 or protruding portions 353 disposed on the first end or the second end, thereby further increasing the contact areas between the plugs 390 and the bit lines 350 and effectively reducing the resistance of the plugs 390. It should be noted that the distance between each sidewall of the portions of the plugs 370 or plugs 390 and the surface of each protruding portion may be the same or different, so that the thicknesses of the portions of the plugs 370 or plugs 390 covering different surfaces of each protruding portions may be correspondingly the same or different. In one embodiment, the greater the distances between the sidewalls of the portions of the plugs 370 or plugs 390 and the surfaces of the protruding portions, the deeper the depths of the portions of the plugs 370 or plugs 390 in the direction perpendicular to substrate 110. The portions with the greater depths are preferably the portions of the plugs 370 or the plugs 390 covering the end surfaces of the protruding portions, but not limited thereto.

On the other hand, in one embodiment, the two adjacent word lines 330 may also be optionally aligned with each other in the third direction D3 (as shown in the left side of FIG. 10), and may also be arranged staggered from each other (as shown in the right side of FIG. 10). That is to say, the first ends or the second ends of the two adjacent word lines 330 may be staggered by the distance g1 in the second direction D2, so that the protruding portions 331 and the protruding portions 331a disposed on the first ends or the protruding portions 333 and the protruding portions 333a disposed on the second ends may also be staggered by the distance g1, as shown on the right side of FIG. 10. Alternatively, the two adjacent bit lines 350 may be optionally aligned with each other in the second direction D2 (as shown in the upper part of FIG. 10), or may be arranged in a staggered manner (as shown in the lower part of FIG. 10). That is to say, the first ends or the second ends of the two adjacent bit lines 350 may be staggered by the distance g1 in the third direction D3, so that the protruding portions 351 and the protruding portions 351a disposed on the first ends or the protruding portions 353 and the protruding portions 353a disposed on the second ends may also be staggered by the distance g1 correspondingly, as shown in the lower part of FIG. 10. In this way, when the plugs 370 electrically connected to the word lines 330 or the plugs 390 electrically connected to the bit lines 350 are provided, the adjacent plugs 370 or the adjacent plugs 390 can have a relatively large manufacturing space to avoid short circuit. In addition, in another embodiment, the plugs 370 electrically connected to the word lines 330 or the plugs 390 electrically connected to the bit lines 350 may also entirely wrap the first ends or the second ends selectively, however, only partially cover the protruding portions 331/351 or protruding portions 333/353 disposed on the first ends or the second ends, such that at least one surface of the protruding portions 331/351 or the protruding portions 333/353 (such as the end surfaces of the protruding portions 331/351 or the protruding portions 333/353) is not covered by the plugs 370/plugs 390, so that there may be a relatively more space between adjacent plugs 370 (as shown in the left side of FIG. 10) or adjacent plugs 390 (as shown in the upper side of FIG. 10).

Therefore, in the semiconductor memory device 300 according to the third embodiment of the present invention, the contact areas of the plugs 370 electrically connected to the word lines 330 and/or the plugs 390 electrically connected to the bit lines 350 may be further increased and the resistance of the plugs 370 and/or the plugs 390 can be more effectively reduced by changing the shape of the protruding portions disposed on the ends of the word lines 330 and/or the bit lines 350. In addition, it should be easily understood by those skilled in the art that the specific shape changes of these protruding portions are not limited to the foregoing. For example, when forming the word lines 330 and/or the bit lines 350, the etching conditions may be further adjusted, so that the formed protruding portions may be partially rounded to perform like an arc shape (not shown in the drawings) or to perform like a hook shape (not shown in the drawings), which is also beneficial to increasing the contact areas between the protruding portions and the plugs.

Generally speaking, in the semiconductor memory device of the present invention, plugs are disposed on two opposite ends of a wire (bit line or word line, etc.) to entirely wrap the two opposite ends of a wire. In this way, the plug may be at least in direct contact with the top surface, sidewalls and end surface of the end of the wire, increasing the contact area between the plug and the wire, and reducing the contact resistance of the plug. Furthermore, a protruding portion may be optionally disposed on the end of the wire to further increase the contact area between the plug and the wire, wherein the protruding portion may have various shapes (such as a linear shape, a L-shape, an arc-shape or a hook-shape) or sizes. Therefore, the semiconductor memory device of the present invention is beneficial to improve the reliability of the electrical connection between the plug and the wire.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate;
   a plurality of active areas, defined on the substrate;

a plurality of first wires, being parallel to each other and extending along a first direction, the first wires crossing over the active areas, wherein each of the first wires has a first end and a second end opposite the first end; and at least one first plug, disposed on the first end of the first wire and electrically connected to the first wire, wherein the at least one first plug is in direct contact with a top surface, sidewalls and an end surface of the first end of the first wires and the at least one first plug entirely covers the end surface of the first end of the first wires, wherein a bottommost surface of the at least one first plug is lower than a bottommost surface of the first wires.

2. The semiconductor memory device of claim 1, wherein a thickness of the at least one first plug covering the sidewalls of the first end is less than a thickness of the at least one first plug covering the end surface of the first end.

3. The semiconductor memory device of claim 1, wherein the at least one first plug covering the sidewalls of the first end and the at least one first plug covering the end surface of the first end have different depths in a direction perpendicular to the substrate.

4. The semiconductor memory device of claim 1, wherein the at least one first plug comprises a plurality of the first plugs, and individual first plugs of the plurality of the first plugs are respectively arranged on each of the first ends of the first wires and are aligned with each other.

5. The semiconductor memory device of claim 1, wherein the first wire is disposed in the substrate.

6. The semiconductor memory device of claim 5, wherein the substrate further comprises a shallow trench isolation surrounding the active areas, wherein the first end of the first wire is disposed in the shallow trench isolation.

7. The semiconductor memory device of claim 1, wherein the first wire is disposed on the substrate.

8. The semiconductor memory device of claim 7, wherein the substrate further comprises a shallow trench isolation surrounding the active areas, wherein the first end of the first wire is disposed on the shallow trench isolation.

9. The semiconductor memory device of claim 1, further comprising:

an insulating layer, covering the active areas and the first wires, wherein the at least one first plug is disposed in the insulating layer, and the top surface of the at least one first plug is coplanar with a top surface of the insulating layer.

10. The semiconductor memory device of claim 1, wherein the first end of each of the first wires comprises a first protruding portion in a L-shaped.

* * * * *